(12) United States Patent
Lee et al.

(10) Patent No.: US 10,134,993 B2
(45) Date of Patent: *Nov. 20, 2018

(54) SUBSTRATE FOR AN ORGANIC LIGHT-EMITTING DEVICE AND METHOD FOR MANUFACTURING THE SAME

(71) Applicant: LG DISPLAY CO., LTD., Seoul (KR)

(72) Inventors: Yeon Keun Lee, Daejeon (KR); Jae Min Moon, Daejeon (KR); Joon Koo Kang, Daejeon (KR); Mun Kyu Joo, Daejeon (KR); Kyoung Sik Moon, Daejeon (KR); Seong Su Jang, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 236 days.

This patent is subject to a terminal disclaimer.

(21) Appl. No.: 13/929,296

(22) Filed: Jun. 27, 2013

(65) Prior Publication Data
US 2013/0286659 A1 Oct. 31, 2013

Related U.S. Application Data

(63) Continuation of application No. 13/928,161, filed on Jun. 26, 2013, which is a continuation of application No. PCT/KR2011/010165, filed on Dec. 27, 2011.

(30) Foreign Application Priority Data

Dec. 27, 2010 (KR) .......................... 10-2010-0135620

(51) Int. Cl.
| | | |
|---|---|---|
| H01L 51/00 | (2006.01) | |
| G02B 5/02 | (2006.01) | |
| H01L 51/52 | (2006.01) | |

(52) U.S. Cl.
CPC ........ H01L 51/0024 (2013.01); G02B 5/0242 (2013.01); G02B 5/0278 (2013.01);
(Continued)

(58) Field of Classification Search
USPC ........ 362/326; 156/230, 247, 246, 249, 242, 156/232
See application file for complete search history.

(56) References Cited

U.S. PATENT DOCUMENTS

2003/0080341 A1* 5/2003 Sakano .................. B29C 67/08
257/79
2007/0257608 A1* 11/2007 Tyan et al. ..................... 313/506
(Continued)

FOREIGN PATENT DOCUMENTS

| JP | 1996-118557 A | 5/1996 |
| JP | 2004-191952 A | 7/2004 |

(Continued)

OTHER PUBLICATIONS

Yokogawa et al. (JP 2003216061); Composite thin film holding substrate, transparent conductive film hllding substrate and vertical cavity surface-emitting body.*

*Primary Examiner* — Michael N Orlando
*Assistant Examiner* — Christian Roldan
(74) *Attorney, Agent, or Firm* — Dentons US LLP

(57) ABSTRACT

Provided is a substrate for an organic light emitting diode including a base substrate, a high refractive scattering layer formed on the base substrate, and having a scattering particle scattering light in a high refractive material, and an adhesive layer formed between the base substrate and the high refractive scattering layer to laminate the base substrate with the high refractive scattering layer, wherein the high refractive scattering layer has a structure in which the scattering particle is immersed in the high refractive material, an average thickness of the high refractive scattering layer is smaller than an average diameter of the scattering particle, a surface of the high refractive scattering layer laminated with the base substrate by the adhesive layer has unevenness formed by the scattering particle, the opposite surface of the
(Continued)

high refractive scattering layer laminated with the base substrate by the adhesive layer has a planarized surface, and a method for manufacturing the same. The substrate may have an excellent degree of planarization and improved light extraction efficiency without degradation in performance of the diode, and low process and material costs and mass-production of the substrate may be easily achieved.

4 Claims, 7 Drawing Sheets

(52) U.S. Cl.
CPC ...... *H01L 51/0096* (2013.01); *H01L 51/5268* (2013.01); *H01L 51/5275* (2013.01); *Y02E 10/549* (2013.01)

(56) References Cited

U.S. PATENT DOCUMENTS

| | | | | |
|---|---|---|---|---|
| 2007/0291363 | A1* | 12/2007 | Asakura | G02B 5/0226 |
| | | | | 359/586 |
| 2010/0003511 | A1* | 1/2010 | So | 428/336 |
| 2010/0091374 | A1* | 4/2010 | Iwata | G02B 1/111 |
| | | | | 359/599 |

FOREIGN PATENT DOCUMENTS

| | | |
|---|---|---|
| JP | 2005-353367 | 12/2005 |
| JP | 2005-353367 A | 12/2005 |
| JP | 2009-076452 | 4/2009 |
| JP | 2009-110930 | 5/2009 |
| JP | 2010-256458 | 11/2010 |

\* cited by examiner

SUBSTRATE FOR AN ORGANIC LIGHT-EMITTING DEVICE AND METHOD FOR MANUFACTURING THE SAME

This application is a Continuation of U.S. patent application Ser. No. 13/928,161, filed Jun. 26, 2013, which is a Continuation Bypass of International Application No. PCT/KR2011/010165, filed Dec. 27, 2011, and claims priority to and the benefit of Korean Patent Application No. 10-2010-0135620, filed Dec. 27, 2010, the disclosures of which are incorporated herein by reference in their entirety.

TECHNICAL FIELD

The present invention relates to a substrate for an organic light-emitting device and a method for manufacturing the same.

BACKGROUND ART

An organic electric device refers to a diode capable of inducing the flow of charges between an electrode and an organic material using holes and/or electrons. According to an operation principle, the organic electric device may be an electronic device in a type in which exitons formed in an organic material layer are divided into electrons and holes by a photon input from an external light source to a diode, and each of the divided electrons and holes is transferred to a different electrode and used as a current source; or an electronic device in a type which is operated by holes and/or electrons injected to an organic material by applying a voltage or current to at least two electrodes. An example of the organic electric device is an organic light emitting diode (OLED), an organic solar cell, an organic photo conductor (OPC) drum or an organic transistor.

The organic light emitting diode refers to a self-emissive diode using an electroluminescent phenomenon in which light is emitted when a current flows in an emissive organic compound. The organic light emitting diode is receiving attention as a next generation material in various fields of industry such as displays, lightings, etc. because of excellent thermal stability and a low driving voltage. However, in an operation of passing light generated in the diode through a stacked structure thereof, total reflection occurs, which decreases internal light extraction efficiency of the diode. Research on increasing in internal light extraction efficiency is being continued.

For example, in Korean Patent Application No. 2008-0122603, a diode deposited on an uneven surface formed by beads is disclosed. However, when an organic material is deposited on the uneven surface, a thickness probably becomes non-uniform, and thus the diode may be electrically unstable.

In Japanese Patent Application No. 2008-299250, scattering of light at an interface between a substrate and a high refractive material by planarizing unevenness formed on a substrate using the high refractive material is disclosed. However, a specific method of evenly forming the high refractive material on the substrate is not disclosed. To form a material layer having a refractive index of 1.8 or more, a method of depositing a high refractive material or a wet-coating a solution in which the high refractive material is dispersed is generally used. When wet coating is performed on an uneven surface, in the beginning of the coating, a coated surface is planarized, but as a solvent evaporates, the surface becomes uneven like the coated surface. Accordingly, when the coating is performed to a thickness at least two times a depth of unevenness larger than a thickness of the dried high refractive layer, a wave-shaped surface is possibly formed. Particularly, since a high refractive planarized surface has a low transmission degree and poor mechanical properties of the coating layer, it is increased in loss of light and decreased in physical strength as a thickness of the planarized surface is increased. As another method, although a method of thickly coating a high refractive inorganic material by deposition and then polishing the resulting layer may be used, it is very disadvantageous in mass-productivity and production cost.

In addition, in U.S. Patent Application No. 2009-365349, a method of preparing a substrate itself using a high refractive material, forming unevenness on one surface of the substrate by sanding and forming a diode on the other surface, which is planarized, is disclosed. However, the substrate manufactured using the high refractive material is very expensive, and the high refractive substrate is degraded in mechanical properties.

DISCLOSURE

Technical Problem

The present invention is directed to providing a novel substrate for an organic electric device having a stacked structure, which has low production and material costs, facilitates mass-production, and has excellent light extraction efficiency and light emission uniformity, and a method for manufacturing the same.

Technical Solution

According to an exemplary embodiment of the present invention, a substrate for an organic light emitting diode includes a base substrate; a high refractive scattering layer formed on the base substrate and comprising scattering particle scattering light in a high refractive material; and an adhesive layer formed between the base substrate and the high refractive scattering layer to laminate the base substrate and the high refractive scattering layer. Here, the high refractive scattering layer has a structure in which the scattering particle is immersed in the high refractive material, a surface of the high refractive scattering layer laminated with the base substrate by the adhesive layer is uneven by the scattering particle, and the other surface of the high refractive scattering layer laminated with the base substrate has a planarized surface.

According to another exemplary embodiment of the present invention, a method of manufacturing a substrate for an organic light emitting diode includes forming a scattering layer on a sacrificial substrate using a coating solution including an organic or inorganic binder and a scattering particle; laminating the base substrate on the scattering layer using an adhesive layer; and removing the sacrificial substrate.

Advantageous Effects

As described above, a substrate for an organic light emitting diode according to the present invention may be improved in light extraction efficiency, have a very excellent degree of planarization and low production cost, and facilitate mass-production without degradation in performances of a diode.

MODE FOR INVENTION

Figure 1:
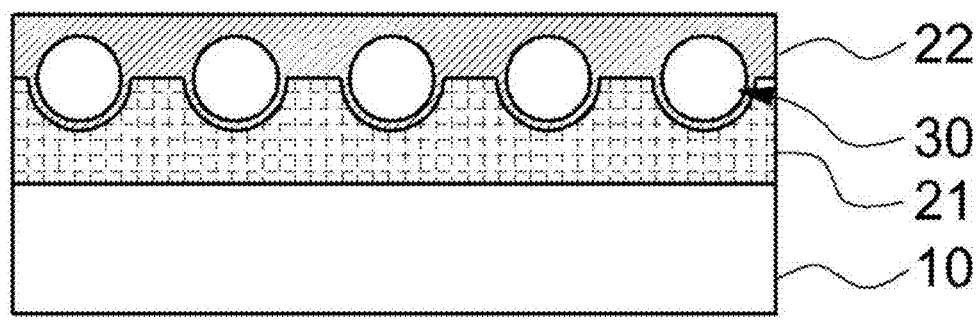
FIG. 1 is a schematic diagram of a stacked structure of a substrate for an organic light emitting diode according to an exemplary embodiment of the present invention.

A substrate for an organic light emitting diode includes a base substrate; a high refractive scattering layer formed on the base substrate and including a scattering particle scattering light in a high refractive material; and an adhesive layer formed between the base substrate and the high refractive scattering layer to laminate the base substrate with the high refractive scattering layer. Here, the high refractive scattering layer has a structure in which the scattering particle is immersed in the high refractive material, an average thickness of the high refractive scattering layer is smaller than that of the scattering particle, a surface of the high refractive scattering layer laminated with the base substrate by the adhesive layer has unevenness formed by the scattering particle, and an opposite surface of the high refractive scattering layer laminated with the base substrate by the adhesive layer is planarized. In addition, the present invention also provides an organic light emitting diode including the substrate.

The organic light emitting diode has internal total reflection due to a. difference in refractive index between layers constituting the device. Particularly, first total reflection of light emitted from an organic material layer occurs at an interface between a transparent electrode having a refractive index of 1.8 or more and a glass substrate having a refractive index of approximately 1.5. In addition, second total reflection of the light transmitted through the glass substrate also occurs at an interface between the glass substrate having a refractive index of 1.8 and air having a refractive index of 1.0. Due to the internal total reflection of the diode, emission efficiency may be degraded, and a luminance may be decreased. The present invention may prevent the decrease in emission efficiency caused by the internal total reflection of the organic light emitting diode and provide excellent light emission uniformity.

To increase the internal light extraction efficiency, an internal scattering layer needs to have excellent scattering characteristics. To this end, surface unevenness of the high refractive material is necessarily very large and rough, and the transparent electrode and an organic diode are necessarily formed in direct contact with the high refractive material. However, when a rough surface of the substrate for an organic material formed to several hundreds of nano meters by deposition is formed, a thickness of the organic material may be non-uniform. When an electric field is formed between the transparent electrode and an metal electrode in which an organic material is present, an overcurrent flows toward the organic material relatively thinly deposited. The organic material is degenerated at a part in which the overcurrent flows, and therefore a short is generated, resulting in no longer use of the device.

To achieve the above-described contradictory objects, a diode substrate may be manufactured to form unevenness on an opposite surface of the high refractive material layer on which the organic diode is deposited. A general method includes forming unevenness in the substrate, covering a relatively high refractive material, and planarizing the covered surface. However, this method has low efficiency because the high refractive material has poor processibility. In addition, when a degree of forming unevenness is increased to enhance scattering characteristics, it is more difficult to planarize the surface using the high refractive material.

The substrate according to an exemplary embodiment of the present invention may easily manufacture an internal light extraction substrate for a high performance organic light emitting diode using wet coating of a binder solution including a scattering particle. Particularly, after unevenness is formed on one surface of the high refractive material, a planar opposite surface in which unevenness is not formed is used as an organic diode-deposited surface. For example, the high refractive scattering layer in which unevenness is severely formed is formed on a sacrificial substrate using a high refractive coating solution. Afterward, when the base substrate is transferred onto the high refractive scattering layer using an adhesive and a sacrificial substrate is removed, the surface of the high refractive scattering layer from which the sacrificial substrate is removed becomes a planarized surface having a very high degree of planarization.

In addition, the base substrate included in the substrate for an organic light emitting diode may be, but is not particularly limited to, a transparent base substrate, for example, a light transmissive plastic substrate or a glass substrate.

The high refractive scattering layer as used herein has a structure in which a planarized surface is formed on the opposite surface of that laminated with the base substrate by the adhesive layer. The planarized surface formed on one surface of the high refractive scattering layer may have a maximum height roughness of 1 μm or less, particularly, 0.5 μm or less, for example, 0.001 to 1 or 0.01 to 0.5 μm in a 10×10 μm² region. Such a high degree of surface planarization may be realized through a manufacturing process using a releasable base substrate according to an exemplary embodiment of the present invention. An organic light emitting diode may be formed by stacking a first electrode, an organic material layer and a second electrode on the planarized surface of the high refractive scattering layer. In the present invention, the "maximum height roughness" refers to a vertical distance between two parallel lines parallel to a center line of a roughness curve in a cut-off and passing the maximum point and the minimum point of the curve. The "cut-off" refers to a wavelength corresponding to a frequency having an yield of 75% obtained using a high-pass filter having a damping factor of −12 dB/oct when the roughness curve is obtained.

In one example, the average thickness of the high refractive scattering layer may be smaller than an average diameter of the scattering particle. Accordingly, the surface of the high refractive scattering layer laminated with the base substrate by the adhesive layer may have unevenness formed by the scattering particle. The average thickness of the high refractive scattering layer may be, but not particularly limited to, 30% to 95%, 50% to 85%, 70% to 90% or 60% to 80% of the average diameter of the scattering particle.

In one exemplary embodiment, the high refractive material included in the high refractive scattering layer has a refractive index of 1.7 or more, particularly 1.8 or more, or 1.7 to 3 or 1.8 to 2.5. For example, the refractive index may be a refractive index with respect to light having a wavelength of 400 nm. A focusing effect with respect to light may be increased by using a high refractive material.

The high refractive material may include an organic or inorganic binder having a high refractive index, or a mixture of a binder and a nano particle. The organic binder may be, but is not particularly limited to, for example, one or at least two of an acryl-based polymer such as methylmethacrylate, an epoxy-based polymer, a fluorine-based polymer and a stylene-based polymer. The high refractive material may be a cured material of a UV curable, heat-curable or two component-type organic binder.

In addition, the high refractive material may further include a high refractive nano particle. For example, the high refractive material may be a cured material of a UV curable organic binder including a high refractive nano particle.

The high refractive nano particle may be any material immersed in the high refractive material to increase a refractive index without particular limitation, which may be a high refractive filler. For example, the high refractive nano particle may be at least one selected from the group consisting of titanium dioxide, alumina, titanium oxide, zirconium oxide, cerium oxide, hafnium oxide, niobium pentoxide, tantalum pentoxide, indium oxide, tin oxide, indium tin oxide, zinc oxide, silicon, zinc sulfide, calcium carbonate, barium sulfate and magnesium oxide, and preferably titanium dioxide or zirconium oxide. In addition, the average diameter of the high refractive nano particle may be in a range of 1 to 100 nm, and preferably 5 to 50 nm. In addition, a content of the high refractive nano particle may be 20 to 90 parts by weight relative to 100 parts by weight of the high refractive material.

The scattering particle is used to form a scattering structure in the substrate, and a scattering effect occurs at an interface between the high refractive material and the scattering particle or between the scattering particle and an adhesive material. For example, a refractive index of the scattering particle Nb and a refractive index of the high refractive material Na may satisfy the relationship of Equation 1.

$$|Na-Nb|\geq 0.2 \qquad \text{[Equation 1]}$$

Particularly, a difference in refractive index between the scattering particle and the high refractive material may be 0.2 or more, and preferably, 0.3 or more. For example, the difference in refractive index between the scattering particle and the high refractive material may be 0.2 to 2.0, and particularly, 0.3 to 1.5.

In addition, an arranging structure of the scattering particle is not particularly limited, but may be a monolayer in the high refractive scattering layer to obtain a uniform scattering effect. The formation of the scattering particle in a monolayer relates to a degree of enhancing an efficiency of an organic light emitting diode. When the scattering particle is formed in multiple layers in the scattering layer, a transmittivity is lower than that of the scattering layer formed of a scattering particle in a monolayer, which exhibits scattering characteristics in the same level as that formed of a scattering particle in a monolayer, and when the organic light emitting diode is manufactured using a substrate having a lower transmittivity, a decrease in efficiency may not be avoided.

The scattering particle may be an organic or inorganic particle. In addition, the scattering particle may have a spherical, oval, or amorphous shape. The scattering particle may be at least one selected from the group consisting of, for example, $TiO_2$, $MgF_2$, $ZrO_2$, $SiO_2$ and $Al_2O_3$. In addition, in the present invention, a specific example of the scattering particle may be, but is not limited to, a bead formed of an organic material such as an acryl-based resin, a styrene resin, an urethane resin, a melamine resin, a benzoguanamine resin, an epoxy resin or a silicon resin; or a bead formed of an inorganic material such as silica or glass. Here, the acryl-based resin, styrene-based resin, or urethane resin may be applied in a crosslinked or non-crosslinked state. In the present invention, as the scattering particle, for example, a benzoguamine-formaldehyde condensation product (EPOSTAR M30: refractive index: 1.66), a melamine-formaldehyde condensation product (EPOSTAR, refractive index: 1.66), or a poly(methyl methacrylate)-based crosslinked product (EPOSTAR MX, refractive index of 1.49), which is produced by Nippon Shokubai, crosslinked poly(methylmethacrylate) (MBX, refractive index:1.49) or crosslinked polystyrene (SBX, refractive index: 1.59), which is produced by Sekisui Chemical, a silicon resin (toss pearl, refractive index: 1.43) produced by Toshiba Silicon, an epoxy resin (Toray pearl, refractive index: 1.59) produced by Toray, a polystyrene-based bead (GS-0459S-6) produced by Ganz or a polystyrene-based bead (HR-59-40, refractive index: 1.59) produced by Sunjin Chemical may be used, but the present invention is not limited thereto.

Even when the scattering effect of light may be obtained, an average diameter of the scattering particle may be, but is not limited to, 0.1 to 20 μm, and particularly, 0.2 to 15 μm. When a diameter of the scattering particle is smaller than the above range, it is difficult to obtain a sufficient light scattering effect, or when the diameter of the scattering particle is higher than the above range, a thickness of the high refractive scattering layer including the scattering particle may become larger. In addition, in terms of processability, when a size of the scattering particle is too small, it may be difficult to suitably maintain dispersity of the scattering particle in a solution during the preparation of a coating solution for wet coating.

The substrate for an organic light emitting diode may further include a high refractive material coating layer having a thickness of 0.1 to 5 μm, which is formed on a planarized surface of the high refractive scattering layer. A degree of planarization of the planarized surface may be enhanced by forming an additional coating layer.

The adhesive layer is coated on a surface of the high refractive scattering layer having unevenness to be adhered to the base substrate. The adhesive layer may be any one which does not inhibit transmission of light emitted inside without particular limitation, and a refractive index of the base substrate Nc and a refractive index of the adhesive layer Nd may satisfy the relationship of Equation 2.

$$|Nc-Nd| \leq 0.2 \quad \text{[Equation 2]}$$

A difference in refractive index between the base substrate and the adhesive layer may be 0.2 or less, and preferably 0.15 or less, for example, 0.01 to 0.2 or 0.01 to 0.15.

In FIG. 1, a schematic diagram of a stacked structure of a substrate for an organic light emitting diode according to one exemplary embodiment of the present invention is shown. Referring to FIG. 1, the substrate for an organic light emitting diode according to the present invention has a structure in which an adhesive layer 21 and a high refractive scattering layer 22 are sequentially stacked on a base substrate 10.

Since a scattering particle 30 is immersed in the high refractive scattering layer 22, and an average thickness of the high refractive scattering layer 22 is smaller than that of the scattering particle 30, an uneven structure formed by the scattering particle 30 is formed. A surface of the high refractive scattering layer 22 having the uneven structure is adhered to the base substrate 10 by the adhesive layer 21, and a planarized surface on which an organic diode may be stacked is formed on a surface of the high refractive scattering layer 20 opposite to the base substrate. The planarized surface of the high refractive scattering layer 20 has a maximum height roughness of 1 μm or less in a 10×10 μm² region.

The base substrate 10 is a glass substrate, and the high refractive scattering layer 22 is formed in a structure in which titanium dioxide nanoparticles are dispersed in an organic binder to have a refractive index of 1.7 or more at a wavelength of 400 nm. The scattering particle 30 has an average diameter of 0.2 to 20 μm, and is formed in a spherical shape or may be formed in an oval or amorphous shape. A difference in refractive index between the scattering particle 30 and the organic binder may be 0.2 or more.

The adhesive layer 21 is used to improve an adhesive strength between the base substrate 10 and the high refractive scattering layer 20. The adhesive layer 21 may be any one capable of minimizing a loss generated in an operation of propagating light penetrated through the high refractive scattering layer 20 toward the base substrate 10 without particular limitation, which may have a low absorption coefficient with respect to a visible ray. The adhesive layer 21 may have a refractive index similar to that of the base substrate 10, and a difference in refractive index between the adhesive layer and the base substrate may be within 0.2. The adhesive layer 21 is formed to have a thickness of 100 μm or less.

Figure 3:
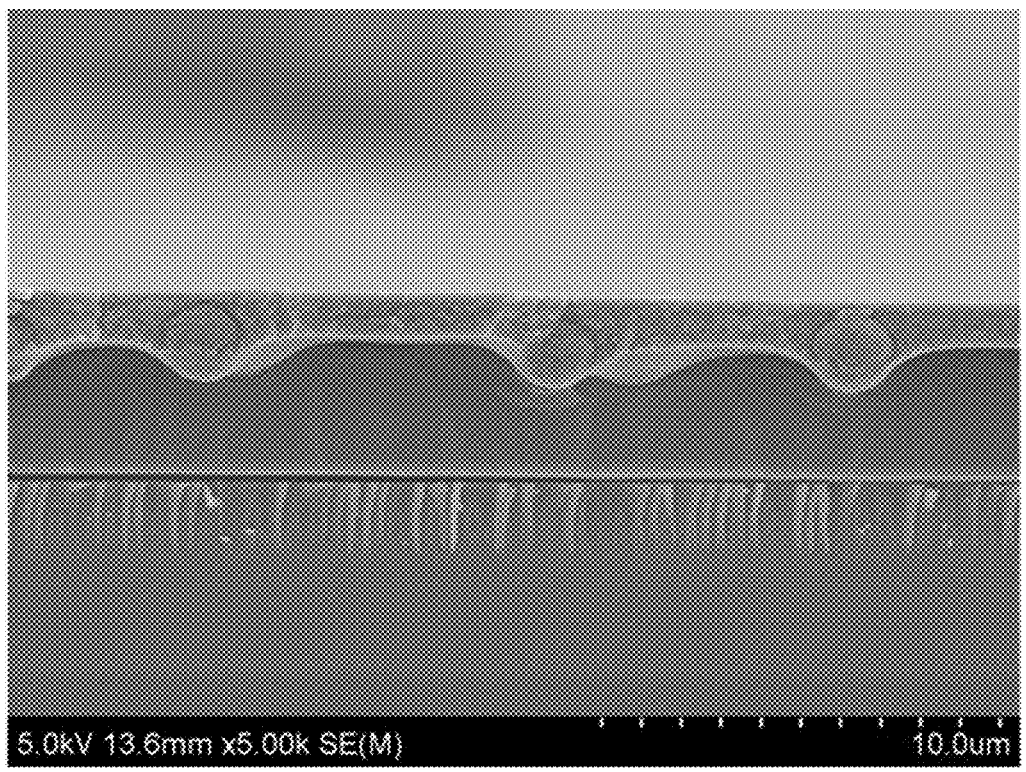
FIG. 3 is an electron microscopic image showing a cross-section of the substrate for an organic light emitting diode according to an exemplary embodiment of the present invention, which includes, from top to bottom, a high refractive scattering layer including a high refractive material and a spherical scattering particle, an adhesive layer and a glass substrate and confirms unevenness formed at an interface between the high refractive scattering layer and the adhesive layer
Figure 4:
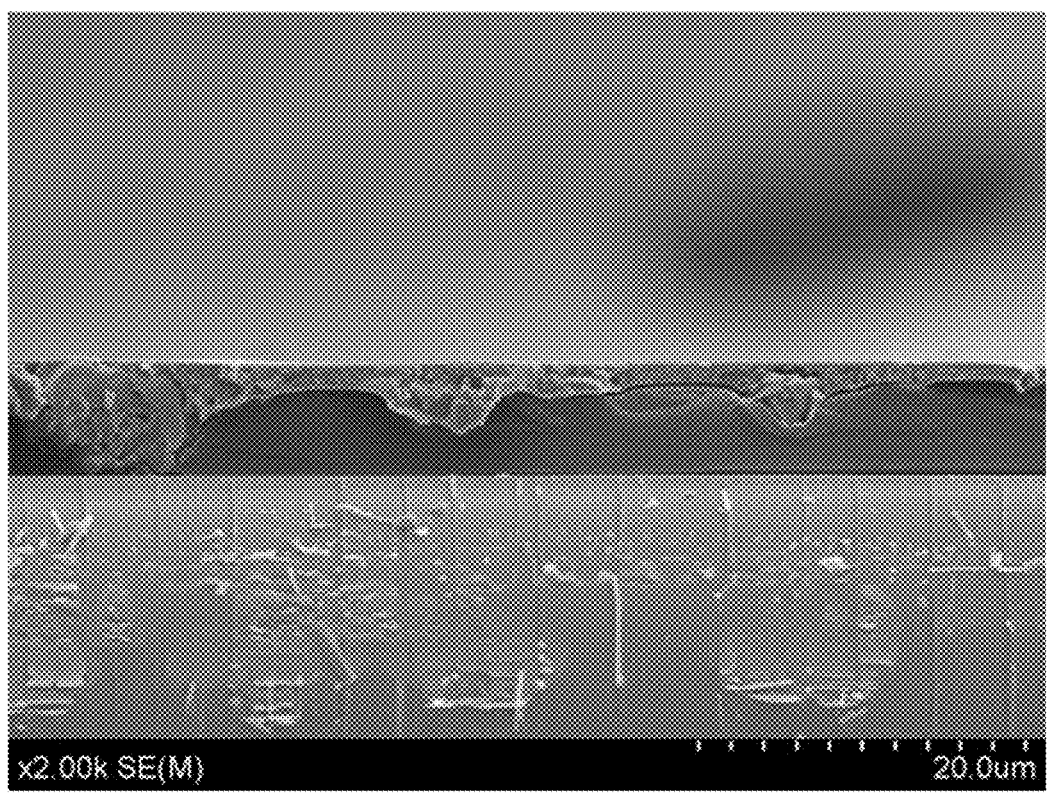
FIG. 4 is an electron microscopic image showing a cross-section of the substrate for an organic light emitting diode according to another exemplary embodiment of the present invention, which includes, from top to bottom, a high refractive scattering layer including a high refractive material and an amorphous scattering particle, an adhesive layer and a glass substrate.

In FIGS. 3 and 4, images of cross-sections of the manufactured substrate for an organic light emitting diode are shown. Referring to FIG. 3, an adhesive layer and a high refractive scattering layer are sequentially formed on an organic substrate, and a spherical scattering particle is immersed in the high refractive scattering layer. FIG. 4 is a cross-sectional view of a substrate manufactured using an amorphous scattering particle. It can be confirmed from both FIGS. 3 and 4 that a uniform planarized surface is formed on a surface of the high refractive scattering layer opposite to the glass substrate.

In addition, the present invention provides a method of manufacturing the above-described substrate for an organic light emitting diode.

In one exemplary embodiment, the method may include forming a high refractive scattering layer on a sacrificial substrate using a high refractive coating solution including a high refractive nano particle, an organic or inorganic binder and a scattering particle; laminating a base substrate on the formed high refractive scattering layer by an adhesive layer; and removing the sacrificial substrate.

According to the method, when the substrate for an organic electric device is formed on the sacrificial substrate and a releasable base substrate is removed from the formed substrate, a surface of the substrate from which the releasable base substrate is removed has a high degree of planarization.

The formation of the high refractive scattering layer may include applying a high refractive coating solution to the sacrificial substrate; drying the applied coating solution; and curing the dried coating solution. The curing of the dried coating solution may be performed by any method of curing the coating solution including an organic or inorganic binder without particular limitation, for example, a UV curing method. In the preparation of the high refractive coating solution, within the range in which one of ordinary skill in the art can easily apply or modify, various kinds of solvent may be suitably used as necessary.

In addition, the high refractive scattering layer may be adhered to the base substrate using the adhesive layer. For example, the adhesive layer is formed by applying an adhesive material to the high refractive scattering layer, and the base substrate is formed thereon, thereby adhering the high refractive scattering layer to the base.

The method may further include forming a coating layer using the high refractive coating solution not having a scattering particle on the surface of the high refractive scattering layer from which the sacrificial substrate is removed after the removing of the sacrificial substrate. A degree of planarization may be enhanced by further forming the coating layer. The coating layer may be formed to have a thickness of 0.1 to 1 μm.

The coating solution may further include a high refractive nano particle. The high refractive nano particle may be any one capable of increasing a refractive index by being dispersed in the organic or inorganic binder without particular limitation, which may be a high refractive filler. For example, the high refractive nano particle may be at least one selected from the group consisting of titanium dioxide, alumina, titanium oxide, zirconium oxide, cerium oxide, hafnium oxide., niobium pentoxide, tantalum pentoxide, indium oxide, tin oxide, indium tin oxide, zinc oxide, silicon, zinc sulfide, calcium carbonate, barium sulfate and magnesium oxide, and preferably titanium dioxide or zirconium oxide. In addition, the high refractive nano particle may have an average diameter of 1 to 100 nm, and particularly 5 to 50 nm. In addition, a content of the high refractive nano particle may be 20 to 90 parts by weight relative to 100 parts by weight of the binder including the high refractive nano particle.

The scattering particle in the scattering layer may be formed in a monolayer, and a detailed description thereof is the same as described above.

In addition, the scattering particle may be an organic or inorganic particle. A shape of the scattering particle may be spherical, oval or amorphous. An average diameter of the scattering particle is not particularly limited as long as a scattering effect of light may be obtained, but may be 0.1 to 20 μm, and particularly 0.2 to 15 μm. A description of the scattering particle is the same as described above.

Figure 6:
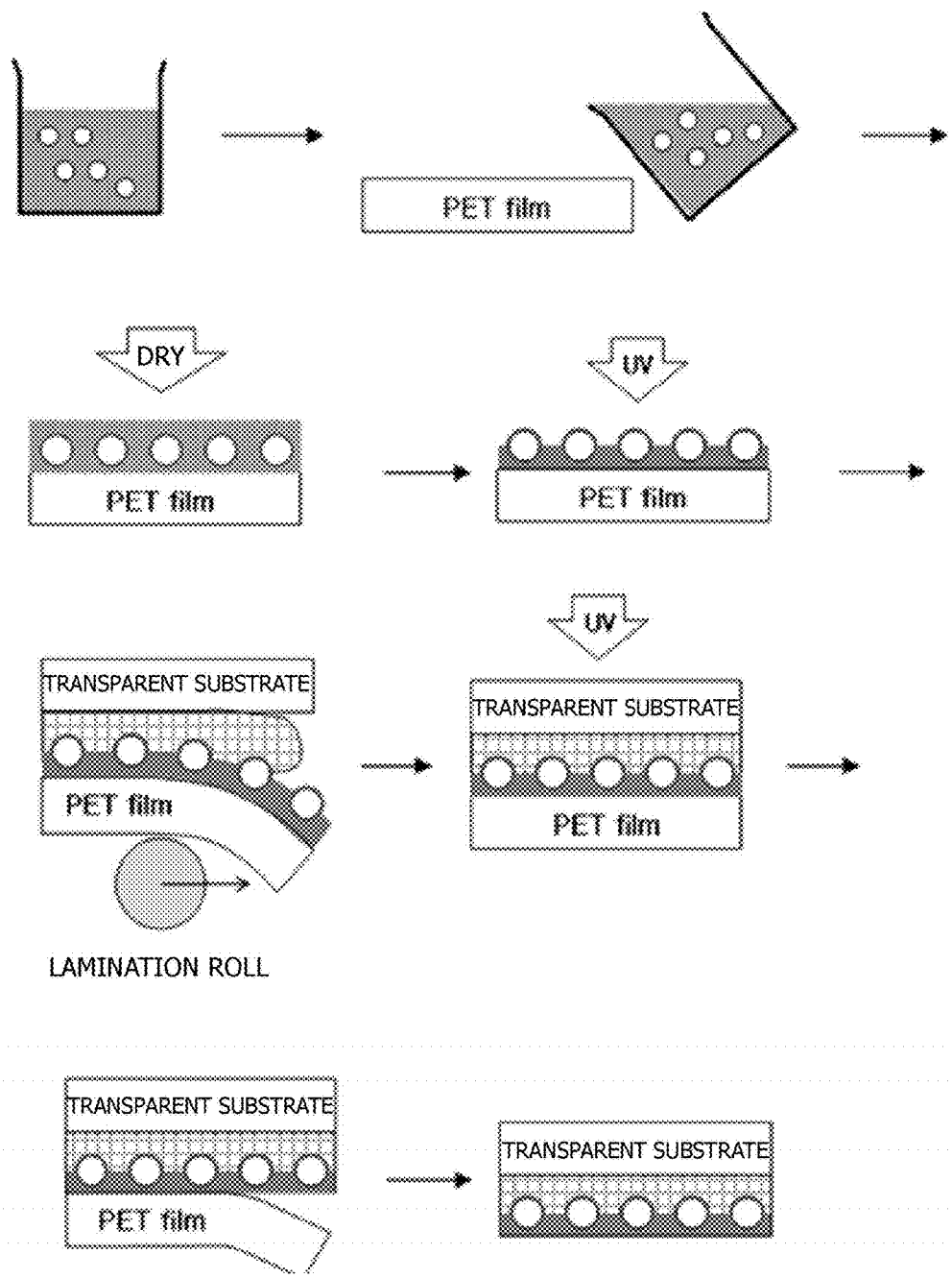
FIG. 6 is a schematic diagram showing a process of manufacturing a substrate for an organic light emitting diode according to an exemplary embodiment of the present invention.

In FIG. 6, a method for manufacturing a substrate for an organic electric device according to an exemplary embodiment of the present invention is schematically shown. Referring to FIG. 6, a high refractive coating solution including a high refractive material and a scattering particle is applied to a sacrificial substrate (PET film). The high refractive material is composed of an organic or inorganic binder, and in some case, may further include a titanium dioxide nano particle. The applied high refractive coating solution is cured through drying and UV irradiation, and during the curing of the high refractive coating solution, a high refractive scattering layer having unevenness formed by the scattering particle is formed. A transparent substrate is laminated on a surface of the high refractive scattering layer having unevenness by an adhesive.

In addition, the present invention provides an organic electric device including the substrate. The organic light emitting diode may include the above-described substrate for an organic light emitting diode; and an organic diode formed on a planarized surface of the substrate. The organic diode may include a first electrode, an organic layer and a second electrode. For example, the organic diode may include a cathode electrode for injecting an electron, an organic layer composed of an electron injection layer, an electron transport layer, an emitting layer, a hole transport layer and a hole injection layer, and an anode electrode for injecting a hole.

Figure 2:
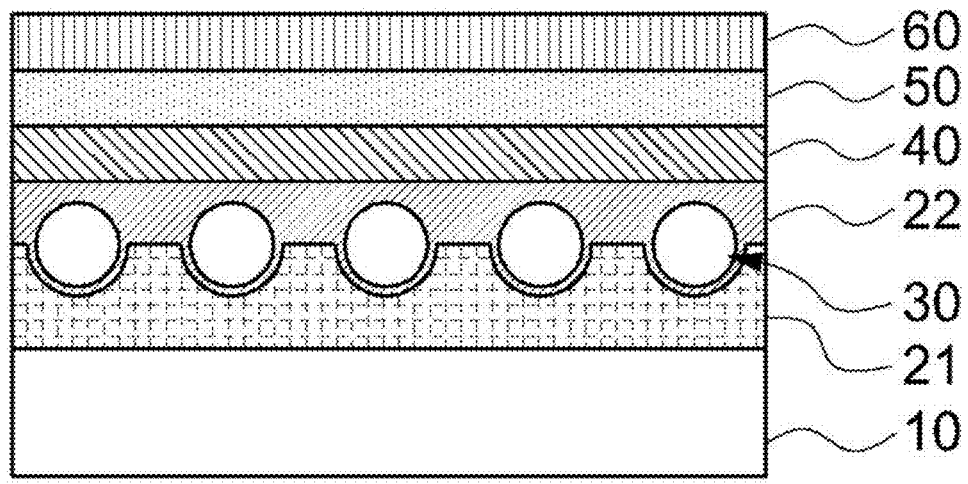
FIG. 2 is a schematic diagram of a stacked structure of an organic light emitting diode according to an exemplary embodiment of the present invention.

FIG. 2 is a schematic diagram of a stacked structure of an organic electric device including a substrate for an organic light emitting diode according to one exemplary embodiment of the present invention. Referring to FIG. 2, a first electrode 40, an organic layer 50 and a second electrode 60 are sequentially formed on the substrate prepared in FIG. 1, thereby constituting an organic light emitting diode. In some cases, an additional stacked structure may be further included to enhance characteristics of the device. The structure stacked on the substrate for an organic light emitting diode may be modified or added in various ways by one of ordinary skill in the art, and for example, the organic diode may be an organic light emitting diode.

Hereinafter, the present invention will be described in further detail with reference to Examples according to the invention, but the scope of the present invention is not limited to the following Examples.

EXAMPLE 1

Manufacture of Substrate for Organic Light Emitting Diode

A coating solution was prepared by sufficiently mixing 1 g of polymer beads (XX75BQ, diameter: 3 μm, Sekisui) having a refractive index of approximately 1.52 in 10 g of a UV curable organic binder (TYT-80-01, solid content: 25 wt %, Toyo ink) in which a high refractive filler is dispersed. Afterward, the coating solution was coated on a surface of a polyester film (PET film) which was not treated with a primer using a coater (#6 Meyer bar coater). Subsequently, the coated coating solution was dried at 100° C. for 2 minutes and cured with an energy of 1 J/cm$^2$ using a UV curing system, thereby manufacturing a film. Separately, a suitable amount of UV curable adhesive (NOA65, Norland Products Inc.) was dropped on a glass substrate for an organic light emitting diode(OLED), the coated coating film was covered such that the coating layer faced the glass substrate, and the polyester film was pressed with a rubber roller to laminate such that the adhesive sufficiently spread between a surface of the high refractive coating layer and the glass substrate. Afterward, the adhesive layer was cured with an energy of 2 J/cm$^2$ using a UV curing system, and the polyester film was removed, resulting in manufacturing a substrate for an organic light emitting diode.

Figure 5:
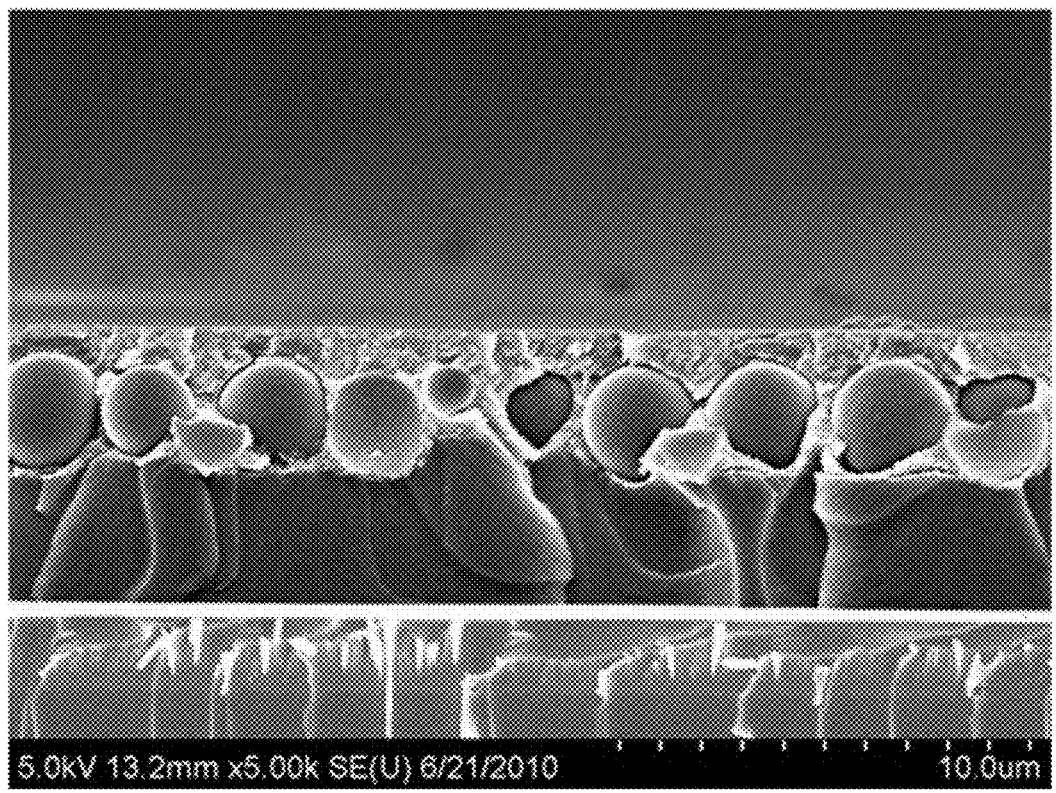
FIG. 5 is an electron microscopic image showing a cross-section of the substrate for an organic light emitting diode according to still another exemplary embodiment of the present invention, in which a diameter of the scattering particle is larger than that of FIG. 3.

In FIG. 5, an image of a cross-section of the manufactured substrate for an organic light emitting diode is shown. Referring to FIG. 5, the adhesive layer and the high refractive scattering layer are sequentially formed on the glass substrate, and a spherical scattering particle is immersed in the high refractive scattering layer. In addition, it can be confirmed that a surface of the high refractive scattering layer opposite to the glass substrate is planarized.

Manufacture of OLED

A 2-stack white OLED having a 2×2 mm$^2$ emitting region was manufactured by sequentially forming layers from an IZO layer to an Al electrode layer shown in Table 1 on a planarized surface (surface in contact with the removed polyester film) of the manufactured substrate for an organic light emitting diode(first to thirteenth layers shown in Table 1 were sequentially formed on the planarized surface). In this operation, as a material for the HIL, HTL, EML, ETL, CGL, HBL, or EIL, any material conventionally used in the field of manufacturing a white OLED was used, and a method of forming the same was also a general method used in this field. A specific stacked structure of the OLED includes the following components shown in Table 1.

TABLE 1

| | | Stacked structure | Thickness (Å) |
|---|---|---|---|
| 1 | IZO | Electrode | 1000 |
| 2 | HIL | Hole injection layer | 300 |
| 3 | HTL | Hole transfer layer | 600 |
| 4 | 1$^{st}$ EML | Red and Green light emitting layer | 1300 |
| 5 | ETL | Electron transfer layer | 150 |
| 6 | CGL | Charge generating layer | 50 |
| 7 | HIL | Hole injection layer | 300 |
| 8 | HTL | Hole transfer layer | 350 |
| 9 | 2$^{nd}$ EML | Blue light emitting layer | 200 |
| 10 | HBL | Hole blocking layer | 50 |
| 11 | ETL | Electron transfer layer | 700 |
| 12 | EIL | Electron injection layer | 15 |
| 13 | Al | Electrode | 1000 |

EXAMPLE 2

A substrate and an OLED formed on a planarized surface thereof were manufactured by the same method as described in Example 1, except that the number of polymer beads was changed to 1.5 g in preparation of a coating solution.

COMPARATIVE EXAMPLE 1

An OLED having the same structure described in Example 1 with reference to Table 1 was formed on a non-alkali glass substrate which was subjected to grinding treatment for an OLED.

COMPARATIVE EXAMPLE 2

The coating solution for a high refractive scattering layer prepared in Example 1 was coated on the substrate.

EXPERIMENTAL EXAMPLE 1

Measurement of Roughness

Degrees of planarization were measured with respect to the substrates manufactured in Examples 1 and 2 and Comparative Examples 1 and 2. Particularly, the maximum height roughness was measured with respect to surfaces of the substrates manufactured in Examples and Comparative Examples, which were opposite to a transparent glass substrate. The maximum height roughness was obtained by measuring a difference between the maximum height and the minimum height of the manufactured sample, which was measured within a 10×10 μm$^2$ region. Measurement results were shown in Table 2.

TABLE 2

|  | Example 1 | Example 2 | Comparative Example 1 |
|---|---|---|---|
| Maximum height roughness (μm) | 0.3 | 0.16 | 1.4 |

Referring to Table 2, it can be seen that the planarized surfaces of the substrates in Examples 1 and 2 according to an exemplary embodiment of the present invention have a maximum height roughness of within 1 μm, but that in Comparative Example 2 is considerably increased in maximum height roughness. Accordingly, it is confirmed that the substrate for an organic light emitting diode according to the present invention has a very high degree of planarization of the high refractive scattering layer.

Figure 7:
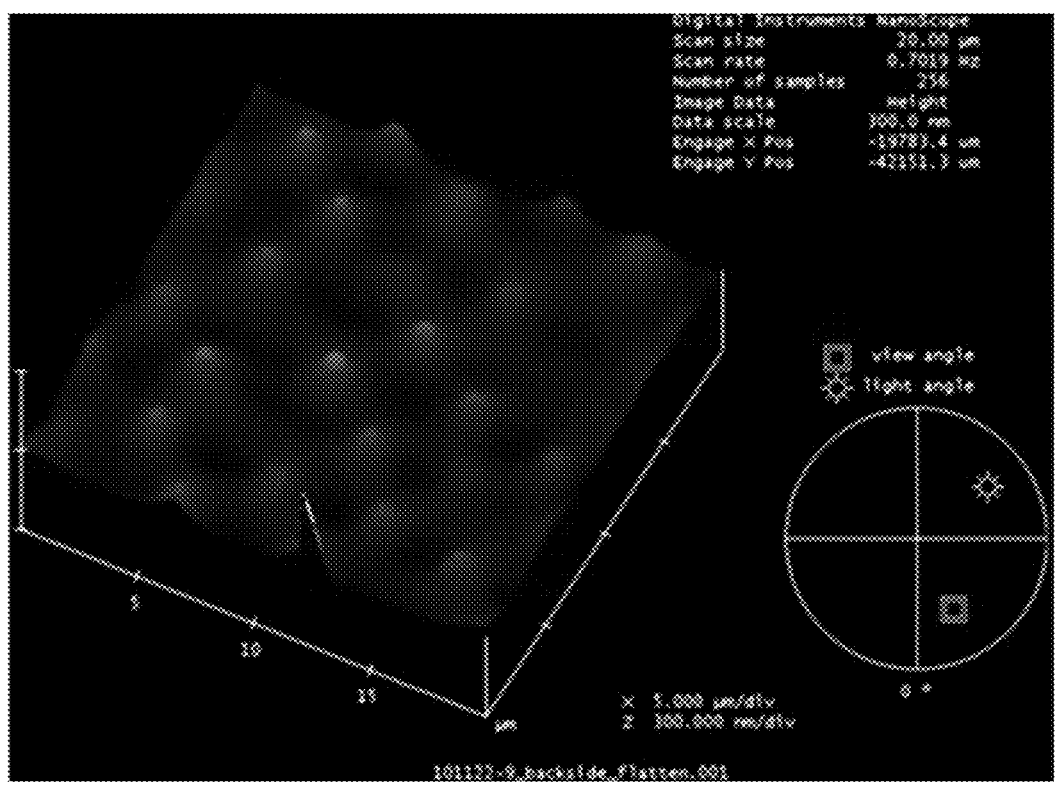
FIG. 7 is a 3D image of a surface of a substrate for an organic light emitting diode manufactured using a sacrificial film according to an exemplary embodiment of the present invention, from which the sacrificial film is removed.

In FIG. 7, an atomic microscopic image of a surface of the planarized layer of the substrate for an organic light emitting diode manufactured in Example 1 is shown. It can be seen that the surface of the high refractive scattering layer from which the polyester film was removed has a planarized surface having a very high degree of planarization, and the maximum height roughness of the planarized surface was measured at 0.3 μm.

Figure 8:
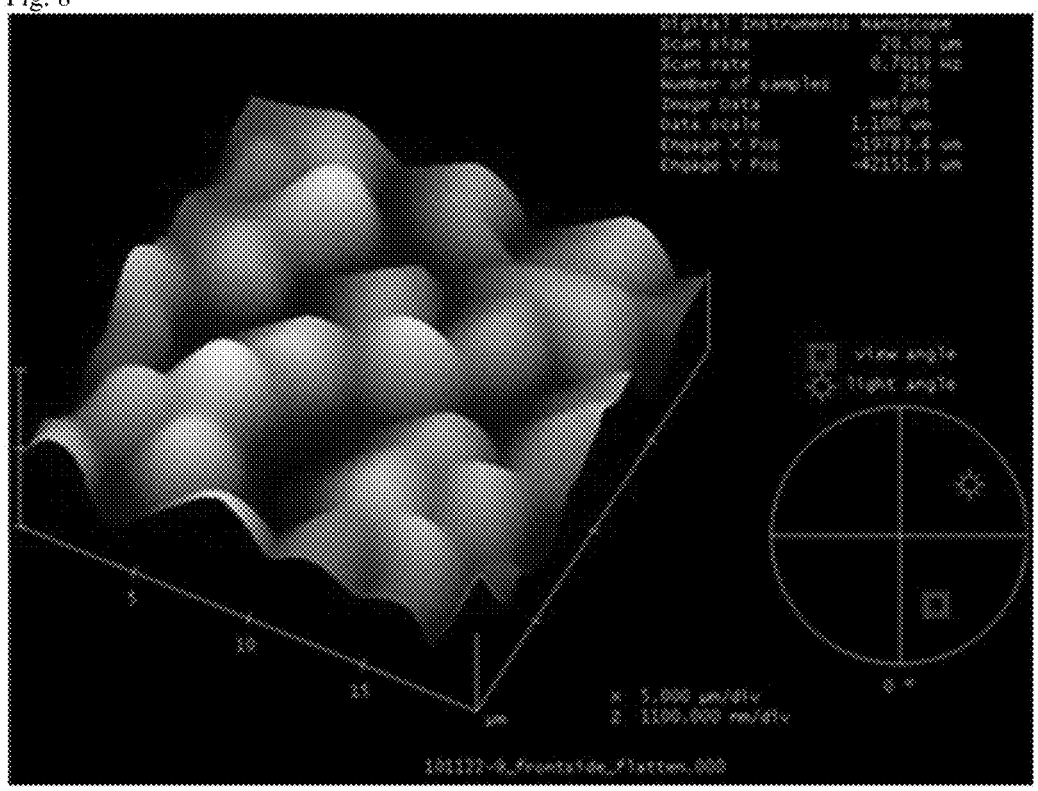
FIG. 8 is a 3D image of a surface of a substrate for an organic light emitting diode manufactured by sequentially stacking layers on a base substrate without using a sacrificial film.

Comparatively, in FIG. 8, an atomic microscopic image of a surface of the substrate for an organic light emitting diode manufactured in Comparative Example 2 is shown. In Comparative Example 2, the substrate was manufactured without a separate releasing film. In Comparative Example 2, the surface was very rough, and a maximum height roughness of the surface was measured at 1.4 μm.

EXPERIMENTAL EXAMPLE 2

Measurement of Light Extraction Efficiency

The OLEDs manufactured in Examples and Comparative Examples were driven under a constant current driving condition of 0.4 mA, and light extraction efficiency was evaluated by measuring a luminous flux of extracted light. During the measurement of the luminous flux of light, a semi-circular lens having a refractive index of 1.52, which was the same as that of the glass substrate, was attached to a surface of the glass substrate opposite to the surface on which the OLED was formed, and the amount of light emitted from the diode was measured using an integrating sphere. Measurement results are shown in Table 3.

TABLE 3

|  | Example 1 | Example 2 | Comparative Example 1 |
|---|---|---|---|
| Luminous flux (lm) | 0.128 | 0.124 | 0.095 |

Referring to Table 3, it is known that Examples 1 and 2 according to an exemplary embodiment of the present invention exhibit a considerably high luminous flux than Comparative Example 1 without a scattering particle. As a result, it can be seen that internal light extraction efficiency is enhanced by the high refractive scattering layer including a scattering particle.

INDUSTRIAL APPLICABILITY

A substrate for an organic light emitting diode according to the present invention can provide an organic light emitting diode having enhanced light extraction efficiency, and can be improved in process efficiency.

The invention claimed is:

1. A substrate for an organic light emitting diode, comprising:
   a base substrate;
   a high refractive scattering layer formed on the base substrate, and having a scattering particle scattering light in a high refractive material;
   an adhesive layer formed between the base substrate and the high refractive scattering layer to laminate the base substrate with the high refractive scattering layer; and
   a high refractive material coating layer,
   wherein an average diameter of the scattering particle is in a range of 3 to 20 μm,
   wherein the high refractive scattering layer has a structure in which the scattering particle is immersed in the high refractive material, a surface of the high refractive scattering layer laminated with the base substrate by the adhesive layer has unevenness formed by the scattering particle, the unevenness formed by the scattering particle is formed between the high refractive scattering layer and the adhesive layer, and
   the opposite surface of the surface of the high refractive scattering layer laminated with the base substrate by the adhesive layer has a planarized surface which has a maximum height roughness of 0.001 to 0.3 μm in a 10×10 μm$^2$ region,
   wherein the high refractive scattering layer has an average thickness in a range of 30% to 80% of an average diameter of the scattering particle,
   wherein the high refractive material has a refractive index of 1.7 to 3 with respect to light having a wavelength of 400 nm,
   wherein the high refractive material coating layer is formed on the planarized surface of the high refractive scattering layer, and has a thickness of 0.1 to 5μm, and
   wherein a refractive index of the high refractive material (Na), a refractive index of the scattering particle (Nb), a refractive index of the base substrate (Nc), and a refractive index of the adhesive layer (Nd) satisfy any one of the relationships represented by Equations 1 and 2:

$$0.3 \leq |Na-Nb| \leq 1.5,\qquad \text{[Equation 1]}$$

and $$0.01 \leq |Nc-Nd| \leq 0.2.\qquad \text{[Equation 2]}$$

2. A substrate for an organic light emitting diode, comprising:
   a base substrate;
   a high refractive scattering layer formed on the base substrate, and having a scattering particle scattering light in a high refractive material;
   an adhesive layer formed between the base substrate and the high refractive scattering layer to laminate the base substrate with the high refractive scattering layer; and
   a high refractive material coating layer,
   wherein an average diameter of the scattering particle is in a range of 3 to 20 μm,
   wherein the high refractive material includes a binder and a nano particle having an average diameter in a range of 1 to 100 nm,
   wherein the high refractive scattering layer has a structure in which the scattering particle is immersed in the high refractive material, a surface of the high refractive scattering layer laminated with the base substrate by the adhesive layer has unevenness formed by the scattering particle, the unevenness formed by the scattering particle is formed between the high refractive scattering layer and the adhesive layer, and the opposite surface of the surface of the high refractive scattering layer laminated with the base substrate by the adhesive layer has a planarized surface which has a maximum height roughness of 0.001 to 0.3 μm in a 10×10 μm² region,
   wherein the high refractive scattering layer has an average thickness in a range of 30% to 80% of an average diameter of the scattering particle,
   wherein the high refractive material has a refractive index of 1.7 to 3 with respect to a light having a wavelength of 400 nm,
   wherein the high refractive material coating layer is formed on the planarized surface of the high refractive scattering layer, and has a thickness of 0.1 to 5 μm, and
   wherein a refractive index of the high refractive material (Na), a refractive index of the scattering particle (Nb), a refractive index of the base substrate (Nc), and a refractive index of the adhesive layer (Nd) satisfy any one of the relationships represented by Equations 1 and 2:

$$0.3 \leq |Na-Nb| \leq 1.5,\qquad \text{[Equation 1]}$$

and $$0.01 \leq |Nc-Nd| \leq 0.2.\qquad \text{[Equation 2]}$$

3. The substrate of claim 1, wherein a refractive index of the high refractive material (Na), a refractive index of the scattering particle (Nb), a refractive index of the base substrate (Nc), and a refractive index of the adhesive layer (Nd) satisfy both Equation 1 and Equation 2.

4. The substrate of claim 2, wherein a refractive index of the high refractive material (Na), a refractive index of the scattering particle (Nb), a refractive index of the base substrate (Nc), and a refractive index of the adhesive layer (Nd) satisfy both Equation 1 and Equation 2.

* * * * *